(12) United States Patent
Masuyama et al.

(10) Patent No.: US 11,818,868 B2
(45) Date of Patent: Nov. 14, 2023

(54) COOLING DEVICE AND POWER CONVERSION DEVICE

(71) Applicant: Mitsubishi Electric Corporation, Tokyo (JP)

(72) Inventors: Takahiro Masuyama, Tokyo (JP); Hirokazu Takabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 175 days.

(21) Appl. No.: 17/431,845

(22) PCT Filed: Feb. 22, 2019

(86) PCT No.: PCT/JP2019/006810
§ 371 (c)(1),
(2) Date: Aug. 18, 2021

(87) PCT Pub. No.: WO2020/170428
PCT Pub. Date: Aug. 27, 2020

(65) Prior Publication Data
US 2022/0151103 A1 May 12, 2022

(51) Int. Cl.
*H05K 7/20* (2006.01)
*H02M 7/00* (2006.01)
*F28F 9/02* (2006.01)

(52) U.S. Cl.
CPC ........ *H05K 7/20336* (2013.01); *H02M 7/003* (2013.01); *H05K 7/20936* (2013.01); *F28F 9/02* (2013.01); *F28F 2275/025* (2013.01); *F28F 2275/04* (2013.01)

(58) Field of Classification Search
None
See application file for complete search history.

(56) References Cited

U.S. PATENT DOCUMENTS

| | | | |
|---|---|---|---|
| 4,145,708 A * | 3/1979 | Ferro | F28D 15/0266 257/722 |
| 5,925,929 A | 7/1999 | Kuwahara et al. | |
| 9,936,607 B2 * | 4/2018 | Chainer | H05K 7/20336 |

(Continued)

FOREIGN PATENT DOCUMENTS

| | | |
|---|---|---|
| JP | S5710681 U | 1/1982 |
| JP | H04225790 A | 8/1992 |

(Continued)

OTHER PUBLICATIONS

Office Action dated Feb. 24, 2022, issued in corresponding Indian Patent Application No. 202127037815, 5 pages.

(Continued)

*Primary Examiner* — Courtney L Smith
(74) *Attorney, Agent, or Firm* — BUCHANAN INGERSOLL & ROONEY PC

(57) ABSTRACT

A cooling device includes a heat-receiving block, a heat conductor, and first heat pipes. The heat-receiving block has a first main surface to which a heating element is fixed. The heat conductor extends along the first main surface and is fixed to the heat-receiving block. The first heat pipes are arranged in a direction in which the heat conductor extends and are fixed to the heat-receiving block at positions farther from the first main surface than the heat conductor is.

20 Claims, 9 Drawing Sheets

(56) References Cited

U.S. PATENT DOCUMENTS

| | | | |
|---|---|---|---|
| 10,785,862 B2* | 9/2020 | Viswanathan | H01L 23/3735 |
| 11,112,186 B2* | 9/2021 | Watanabe | F28D 15/0266 |
| 11,282,767 B2* | 3/2022 | Chen | H01L 23/46 |
| 11,348,850 B2* | 5/2022 | Takabayashi | H01L 23/367 |
| 2006/0196640 A1* | 9/2006 | Siu | H01L 23/473 |
| | | | 257/E23.103 |
| 2008/0043438 A1* | 2/2008 | Refai-Ahmed | H01L 23/427 |
| | | | 257/E23.088 |
| 2017/0156240 A1* | 6/2017 | Silvennoinen | H05K 7/20936 |
| 2022/0053634 A1* | 2/2022 | Zhou | H05K 7/20336 |
| 2022/0149747 A1* | 5/2022 | Masuyama | H02M 7/003 |

FOREIGN PATENT DOCUMENTS

| | | |
|---|---|---|
| JP | 2000-269676 A | 9/2000 |
| JP | 2003311469 A | 11/2003 |
| JP | 2004254387 A | 9/2004 |
| JP | 2007288997 A | 11/2007 |

OTHER PUBLICATIONS

International Search Report (PCT/ISA/210) with translation and Written Opinion (PCT/ISA/237) dated Apr. 16, 2019, by the Japan Patent Office as the International Searching Authority for International Application No. PCT/JP2019/006810. (10 pages).

Office Action (Notice of Reasons for Refusal) dated Oct. 19, 2021, in corresponding Japanese Patent Application No. 2021-501260 and English translation of the Office Action. (9 pages).

* cited by examiner

US 11,818,868 B2

COOLING DEVICE AND POWER CONVERSION DEVICE

TECHNICAL FIELD

The present disclosure relates to a cooling device and a power conversion device including a cooling device.

BACKGROUND ART

A cooling member is thermally connected to an electronic component to prevent heat damage during electric conduction. The cooling member dissipates heat transferred from the electronic component to air around the cooling member. Thus, the electronic component is cooled. Examples of the cooling member include a heat-pipe cooling device. An example of such a cooling device is described in Patent Literature 1. The cooling device disclosed in Patent Literature 1 includes a cooling block having a main surface to which a heating element is fixed, multiple heat pipes located in the cooling block and extending in the vertical direction, and multiple temperature-uniformizing heat pipes fixed to a surface of the cooling block opposite to the main surface and extending in the horizontal direction. A first end of each heat pipe extending in the vertical direction is drawn out of the cooling block to have fins fixed to the first end.

CITATION LIST

Patent Literature

Patent Literature 1: Unexamined Japanese Patent Application Publication No. 2004-254387

SUMMARY OF INVENTION

Technical Problem

The cooling device disclosed in Patent Literature 1 includes multiple heat pipes arranged in the horizontal direction and extending in the vertical direction. The multiple heat pipes extending in the vertical direction are individually fixed to the cooling block. When the main surface of the cooling block to which the heating element is fixed has a temperature difference in the horizontal direction, a refrigerant enclosed in some of the heat pipes is heated and evaporates, whereas a refrigerant enclosed in other heat pipes remains liquid without being fully heated. This structure cools the heating element with circulation of the refrigerant in some of the heat pipes alone and thus the cooling efficiency of a cooling device is insufficient.

In response to the above issue, an objective of the present disclosure is to improve the cooling efficiency of a cooling device.

Solution to Problem

To achieve the above objective, a cooling device according to an aspect of the present disclosure includes a heat-receiving block, a heat conductor, and first heat pipes. The heat-receiving block has a first main surface to which a heating element is fixed. The heat conductor extends along the first main surface and fixed to the heat-receiving block. The first heat pipes are arranged in a direction in which the heat conductor extends and are fixed to the heat-receiving block at positions farther from the first main surface than the heat conductor is.

Advantageous Effects of Invention

The cooling device according to the above aspect of the present disclosure includes the heat conductor fixed to the heat-receiving block, and the first heat pipes arranged in the direction in which the heat conductor extends and are fixed to the heat-receiving block at the positions farther from the first main surface of the heat-receiving block to which the heating element is fixed than the heat conductor is. The heat conductor reduces variations in the quantity of heat transferred to the first heat pipes arranged in the direction in which the heat conductor extends. Thus, the cooling device can improve the cooling efficiency.

DESCRIPTION OF EMBODIMENTS

Figure 1:
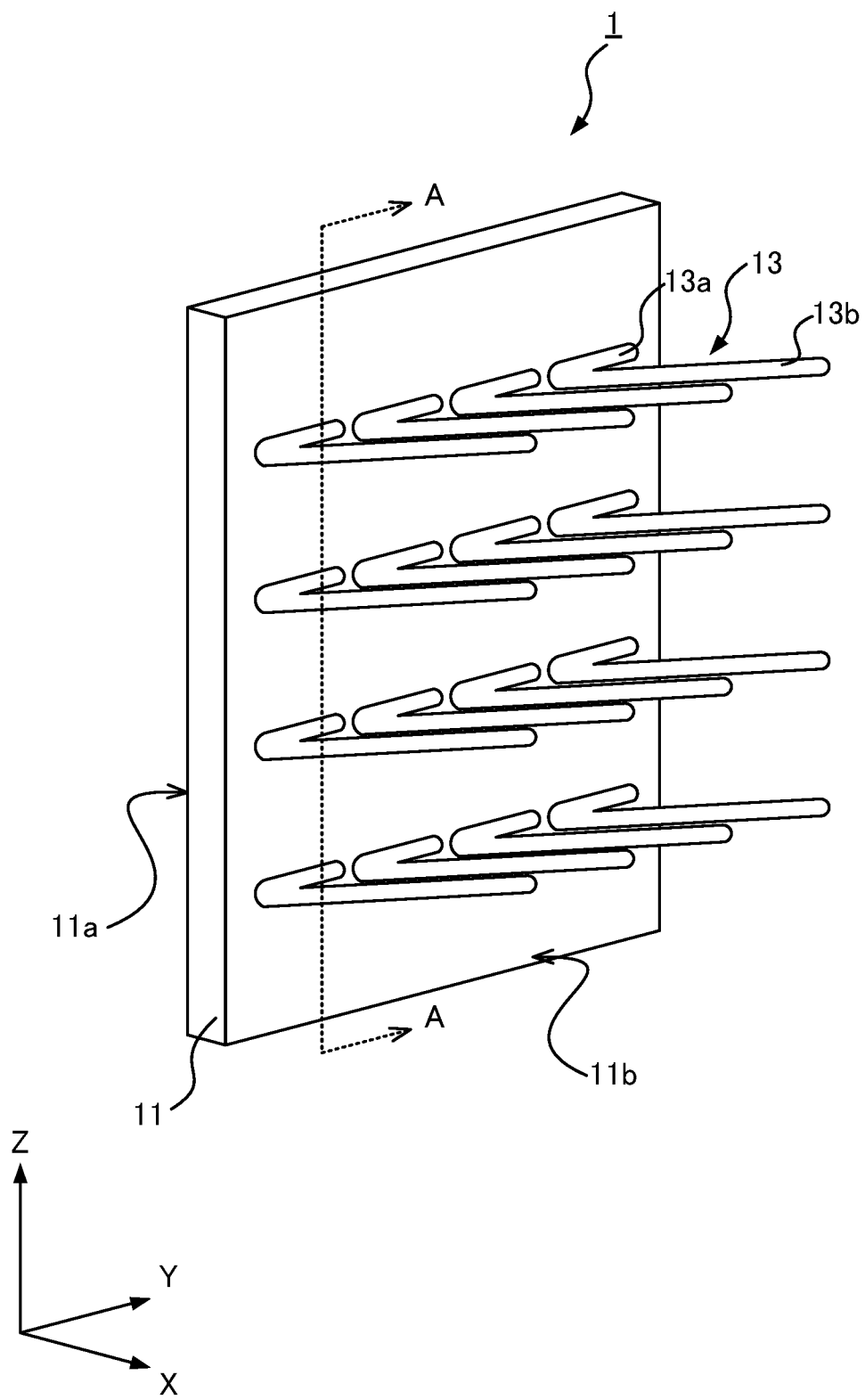
FIG. 1 is a perspective view of a cooling device according to Embodiment 1 of the present disclosure.

A cooling device and a power conversion device according to embodiments of the present disclosure are described in detail with reference to the drawings. In the figures, the same or equivalent components are given the same reference numerals.

Embodiment 1

Figure 2:
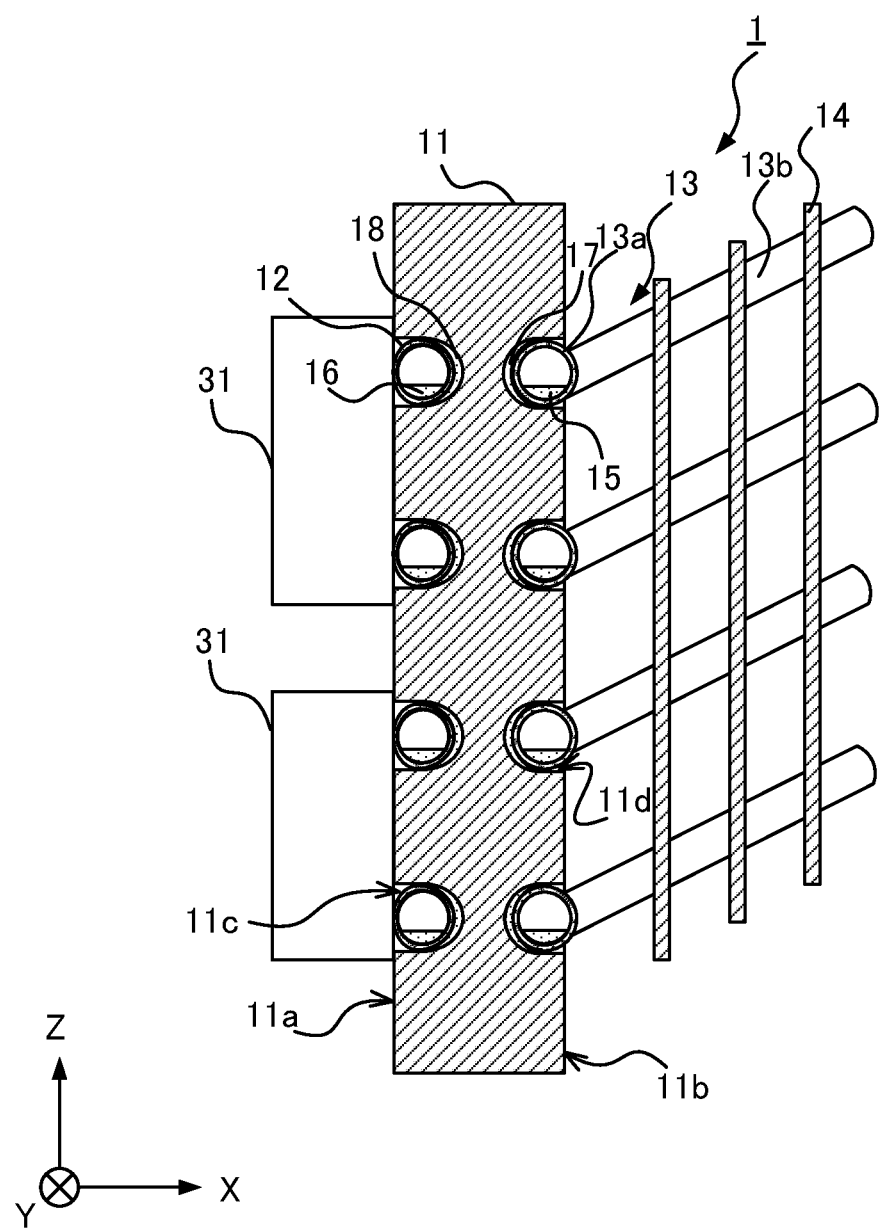
FIG. 2 is a cross-sectional view of the cooling device according to Embodiment 1 taken along line A-A in FIG. 1 as viewed in the direction indicated by arrows.

To prevent failure of an electronic component due to heat generation of the electronic component during electric conduction, a cooling device that cools the electronic component is thermally connected to the electronic component. A cooling device 1 according to Embodiment 1 illustrated in FIGS. 1 to 3 includes a heat-receiving block 11 including a plate member, heat conductors 12 fixed to the heat-receiving block 11, first heat pipes 13 fixed to the heat-receiving block 11, and fins 14 fixed to the first heat pipes 13. Fixing includes integral formation. Specifically, the heat conductors 12 fixed to the heat-receiving block 11 may be integrally formed with the heat-receiving block 11. Similarly, the first heat pipes 13 may be integrally formed with the heat-receiving block 11. FIG. 1 does not illustrate the fins 14 for ease of illustration. FIG. 2 is a cross-sectional view of the cooling device 1 taken along line A-A in FIG. 1 as viewed in the direction indicated by arrows. In Embodiment 1, the heat conductors 12 include heat pipes, and thus are hereafter referred to as second heat pipes 12. The cooling device 1 also includes first solder 17 that fixes the first heat pipes 13 to the heat-receiving block 11 and second solder 18 that fixes the heat conductors 12 to the heat-receiving block 11.

Figure 3:
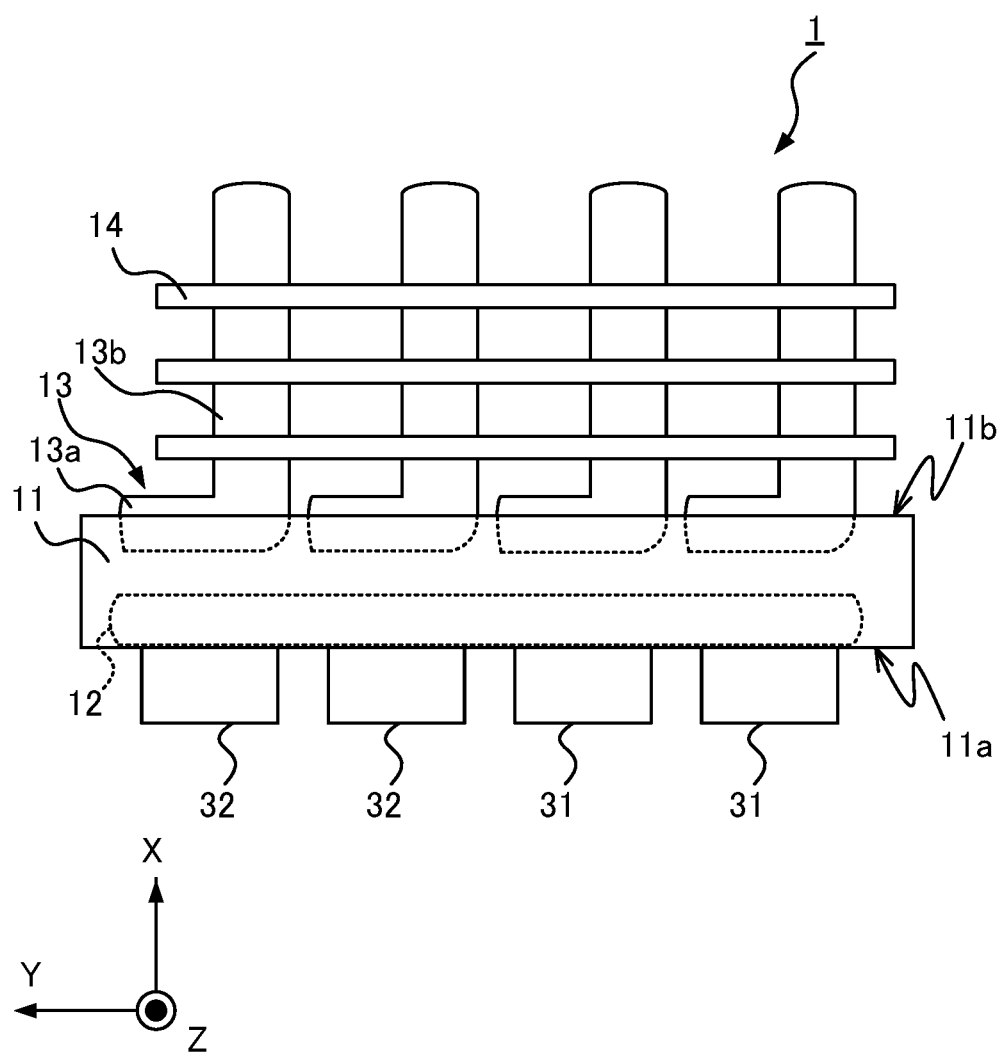
FIG. 3 is a top view of the cooling device according to Embodiment 1.

In FIGS. 1 to 3, the Z-axis denotes a vertical direction. The X-axis denotes a direction orthogonal to a first main surface 11a and a second main surface 11b of the heat-receiving block 11, and the Y-axis denotes a direction orthogonal to the X-axis and the Z-axis.

The components of the cooling device 1 having the above-mentioned configuration are described, focusing on an example in which the cooling device 1 includes four second heat pipes 12, and sixteen first heat pipes 13 including four pipes arranged for each second heat pipe 12 in the direction in which the second heat pipe 12 extends.

As illustrated in FIGS. 2 and 3, heating elements 31 and 32 formed by electronic components that generate heat during electric conduction are fixed to the first main surface 11a of the heat-receiving block 11. The quantity of heat from the heating elements 31 and 32 varies (described in detail later). Thus, the first main surface 11a has temperature variations.

The first main surface 11a has multiple grooves 11c extending in the Y-direction. The second main surface 11b of the heat-receiving block 11 opposite to the first main surface 11a has multiple grooves 11d extending in the Y-direction.

Each groove 11c receives the corresponding second heat pipe 12, and the second heat pipe 12 is fixed to the heat-receiving block 11 with the second solder 18. Each groove 11d receives the corresponding first heat pipes 13, and the first heat pipes 13 are fixed to the heat-receiving block 11 with the first solder 17.

The grooves 11c are arranged at intervals in the Z-direction. Each of the grooves 11c and the corresponding one of the grooves 11d are arranged side by side in the X-direction. The heat-receiving block 11 with the above structure is formed of a highly thermally conductive material, for example, metal such as copper or aluminum.

The second heat pipes 12 are thermally equalizing heat pipes for dissipating heat generated by the heating elements 31 and 32 in the Y-direction and extend along the first main surface 11a to be fixed to the heat-receiving block 11. Specifically, the second heat pipes 12 are received in the respective grooves 11c and fixed to the heat-receiving block 11 with the second solder 18. In the example in FIG. 2, the second heat pipes 12 are received in the grooves 11c and fixed to the heat-receiving block 11 while being partially exposed. In some embodiments, the second heat pipes 12 may be adjacent to the heating elements 31 and 32. Specifically, the second heat pipes 12 are received in the grooves 11c and located near the heating elements 31 and 32 to enable transfer of heat generated by the heating elements 31 and 32 to the second heat pipes 12.

As described above, the second heat pipes 12 adjacent to the heating elements 31 and 32 transfer heat transferred from the heating elements 31 and 32 in the Y-direction. In some embodiments, the second heat pipes 12 may have thermal conductivity higher than the thermal conductivity of the heat-receiving block 11. Specifically, the second heat pipes 12 are formed of a highly thermally conductive material, for example, metal such as copper or aluminum. A refrigerant 16 is enclosed in the second heat pipes 12.

The multiple first heat pipes 13 are arranged in the direction in which the second heat pipes 12 extend and are fixed to the heat-receiving block 11 at positions farther from the first main surface 11a than the second heat pipes 12 are. Specifically, four first heat pipes 13 are arranged in the direction in which the second heat pipes 12 extend at positions farther from the first main surface 11a than the second heat pipes 12 are. Each first heat pipe 13 is received in the corresponding groove 11d and is fixed to the heat-receiving block 11 with the first solder 17.

In some embodiments, the first heat pipes 13 may have a shape extending away from the second main surface 11b to dissipate heat transferred from the heating elements 31 and 32. Specifically, each first heat pipe 13 includes a header pipe 13a extending along the corresponding second heat pipe 12 and fixed to the heat-receiving block 11, and a branch pipe 13b continuous with the header pipe 13a and extending away from the second main surface 11b. A refrigerant 15 is enclosed in the first heat pipes 13. The header pipe 13a and the branch pipe 13b included in each first heat pipe 13 are formed of a highly thermally conductive material, for example, metal such as copper or aluminum.

Each of the second heat pipes 12 and the corresponding header pipes 13a are located side by side on the plane orthogonal to the direction in which the second heat pipes 12 extend, or the XZ plane, in the direction orthogonal to the first main surface 11a. In other words, each of the second heat pipes 12 and the corresponding header pipes 13a are located side by side in the X-direction.

Each fin 14 has through-holes and is fixed to the corresponding branch pipes 13b of the first heat pipes 13 while allowing the branch pipes 13b to pass through the through-holes. The fins 14 improve the cooling efficiency of the cooling device 1.

The refrigerant 15 is enclosed in the first heat pipes 13 in the gas-liquid two-phase state. The refrigerant 15 is formed of a substance that evaporates with heat transferred from the heating elements 31 and 32 and liquefies by dissipating heat into air around the cooling device 1, such as water, alcohol, or an alternative chlorofluorocarbon. When air around the cooling device 1 can reach or fall below the melting point of the refrigerant 15, the refrigerant 15 may preferably contain an anti-freezing agent to prevent the refrigerant 15 from freezing.

The refrigerant 16 is enclosed in the second heat pipes 12 in the gas-liquid two-phase state. The refrigerant 16 is formed of a substance that evaporates with heat transferred from the heating elements 31 and 32 and liquefies by dissipating heat into air around the cooling device 1, such as water, alcohol, or an alternative chlorofluorocarbon.

The first solder 17 is applied to the grooves 11d, melts when heated, and then is cooled to solidify. Thus, the first heat pipes 13 received in the grooves 11d are fixed to the heat-receiving block 11. The first solder 17 is formed of a substance having a melting point sufficiently higher than the temperature that the heat-receiving block 11 can have when heated with heat transferred from the heating elements 31 and 32.

The second solder 18 is applied to the grooves 11c, melts when heated, and then is cooled to solidify. Thus, the second heat pipes 12 received in the grooves 11c are fixed to the heat-receiving block 11. The second solder 18 is formed of a substance having a melting point sufficiently higher than the temperature that the heat-receiving block 11 can have when heated with heat transferred from the heating elements 31 and 32.

In some embodiments, the substance forming the second solder 18 and the substance forming the first solder 17 may be selected to satisfy that the melting point of the second solder 18 is higher than the melting point of the first solder 17. A structure where the melting point of the second solder 18 is higher than the melting point of the first solder 17 prevents the second heat pipes 12 from being detached from the heat-receiving block 11 in an operation of bonding the first heat pipes 13 to the heat-receiving block 11 after bonding the second heat pipes 12 to the heat-receiving block 11.

Figure 4:
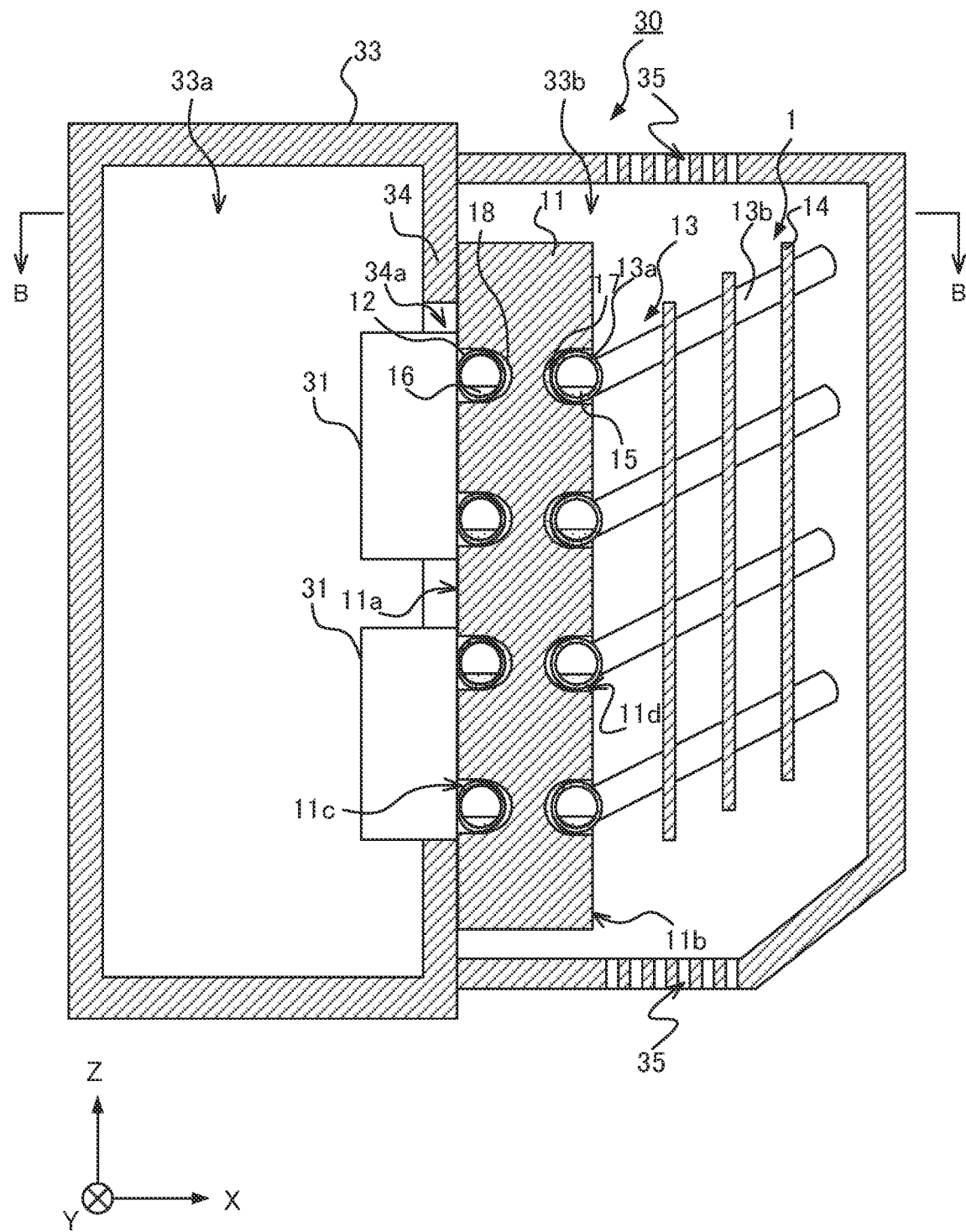
FIG. 4 is a cross-sectional view of a power conversion device according to Embodiment 1.
Figure 5:
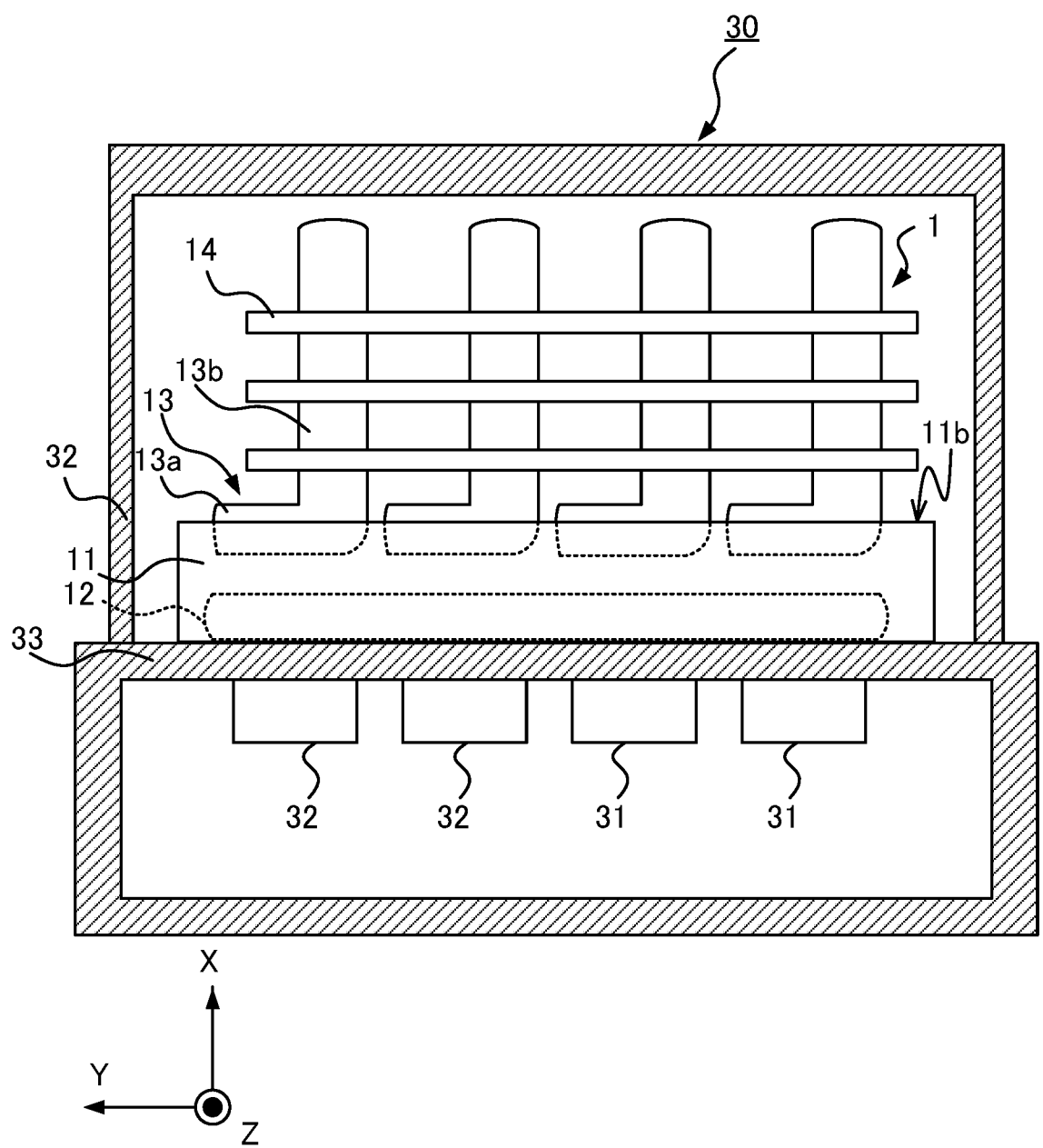
FIG. 5 is a cross-sectional view of the power conversion device according to Embodiment 1 taken along line B-B in FIG. 4 as viewed in the direction indicated by arrows.

As illustrated in FIGS. 4 and 5, the cooling device 1 with the above structure is mounted on a power conversion device 30. FIG. 5 is a cross-sectional view taken along line B-B in FIG. 4 as viewed in the direction indicated by arrows. The power conversion device 30 includes a housing 33, the heating elements 31 and 32 accommodated in the housing 33, and the cooling device 1 that cools the heating elements 31 and 32. The housing 33 includes a partition 34 that divides the inside of the housing 33 into an enclosed space 33a and an open space 33b. The enclosed space 33a accommodates the heating elements 31 and 32. The open space 33b accommodates the cooling device 1. The partition 34 has an opening 34a. The opening 34a is covered with the first main surface 11a of the heat-receiving block 11 included in the cooling device 1. The heating elements 31 and 32 are attached to the first main surface 11a that covers the opening 34a. The first main surface 11a covering the opening 34a prevents outside air, water, and dust from flowing into the enclosed space 33a.

The housing 33 has intake-exhaust ports 35 in two surfaces facing the open space 33b and orthogonal to the Z-direction. Cooling air introduced through one of the intake-exhaust ports 35 flows between the branch pipes 13b along the fins 14 and exits through the other one of the intake-exhaust ports 35. The cooling device 1 transfers heat transferred from the heating elements 31 and 32 to the cooling air, to thereby cool the heating elements 31 and 32.

Figure 6:
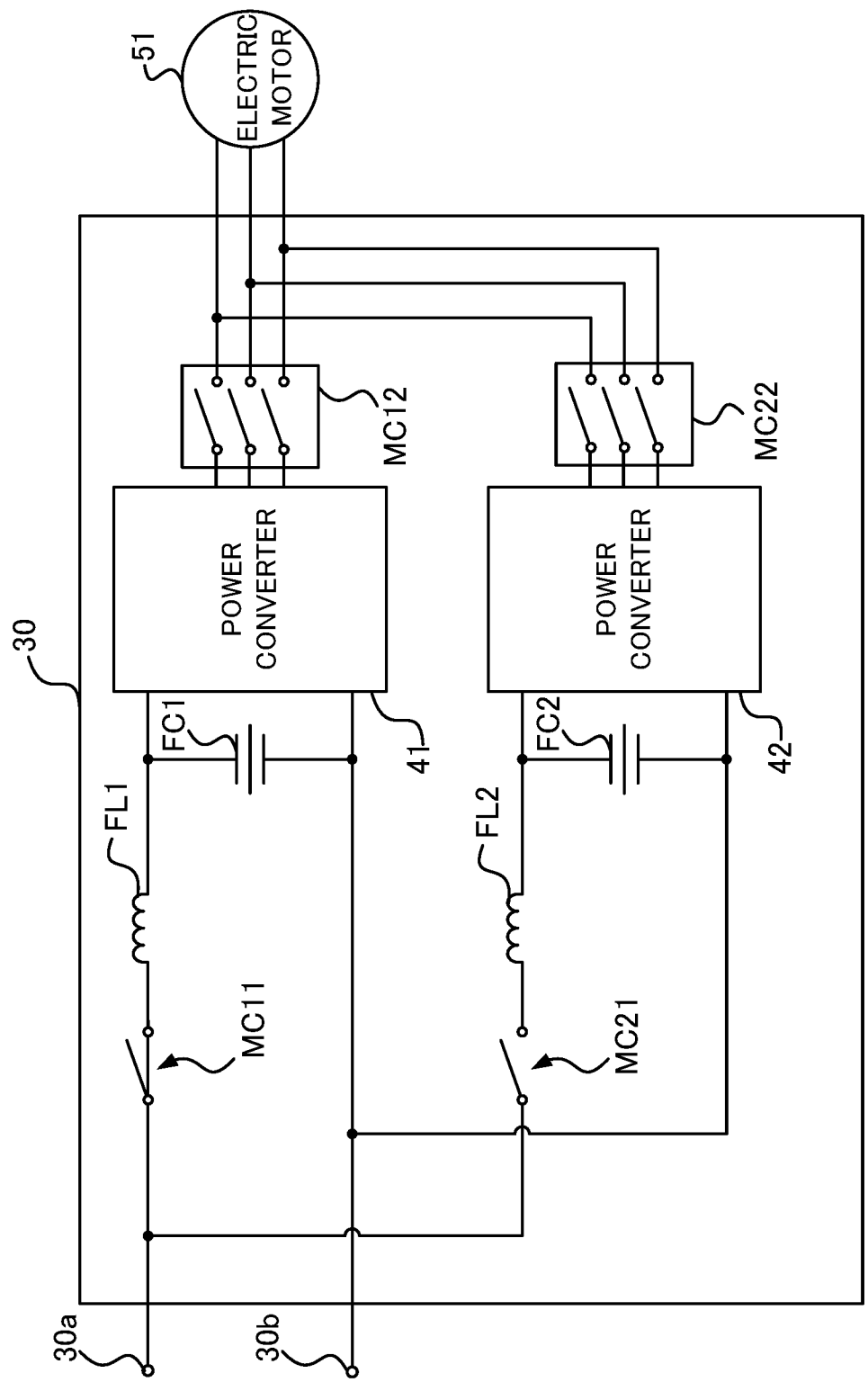
FIG. 6 is a block diagram of the power conversion device according to Embodiment 1.

As illustrated in FIG. 6, the power conversion device 30 converts power supplied from a power source through a positive electrode terminal 30a to power to be supplied to an electric motor 51 serving as a load and supplies the converted power to the electric motor 51.

Specifically, the power conversion device 30 includes the positive electrode terminal 30a connected to the power source, a negative electrode terminal 30b grounded, and contactors MC11 and MC21 each having a first end connected to the positive electrode terminal 30a. The power conversion device 30 also includes a filter reactor FL1 having a first end connected to a second end of the contactor MC11, and a filter reactor FL2 having a first end connected to a second end of the contactor MC21. The power conversion device 30 also includes a filter capacitor FC1 having a first end connected to a second end of the filter reactor FL1 and a second end connected to the negative electrode terminal 30b, and a filter capacitor FC2 having a first end connected to a second end of the filter reactor FL2 and a second end connected to the negative electrode terminal 30b.

The power conversion device 30 also includes a power converter 41 including primary terminals between which the filter capacitor FC1 is connected, and a power converter 42 including primary terminals between which the filter capacitor FC2 is connected. The power conversion device 30 also includes a contactor MC12 including primary terminals respectively connected to secondary terminals of the power converter 41 and secondary terminals connected to the electric motor 51, and a contactor MC22 including primary terminals respectively connected to secondary terminals of the power converter 42 and secondary terminals connected to the electric motor 51.

The power conversion device 30 is designed for a standby redundancy system. Specifically, the power converter 41 is set as an operation system, and the power converter 42 is set as a standby system. While the power converter 41 operates normally, the contactors MC11 and MC12 are closed, and the contactors MC21 and MC22 are opened. When the power converter 42 is set as an operation system upon a failure of the power converter 41, the power converter 42 operates, the contactors MC11 and MC12 are opened, and the contactors MC21 and MC22 are closed.

The positive electrode terminal 30a is connected to the power source through, for example, a high-speed circuit breaker (not illustrated). When the power conversion device 30 is mounted on an electric railway vehicle, the positive electrode terminal 30a is connected to a current collector, and the negative electrode terminal 30b is grounded.

The contactors MC11 and MC21 are closed or opened by a contactor controller (not illustrated). Upon the contactor MC11 being closed, the first end and the second end of the contactor MC11 are electrically connected to each other. Thus, the power converter 41 is electrically connected to the power source. Upon the contactor MC11 being opened, the first end and the second end of the contactor MC11 are electrically disconnected. Thus, the power converter 41 is electrically disconnected from the power source.

Similarly, upon the contactor MC21 being closed, the first end and the second end of the contactor MC21 are electrically connected to each other. Thus, the power converter 42 is electrically connected to the power source. Upon the contactor MC21 being opened, the first end and the second end of the contactor MC21 are electrically disconnected. Thus, the power converter 42 is electrically disconnected from the power source.

The filter reactors FL1 and FL2 decrease harmonic components. The filter capacitors FC1 and FC2 are charged with power supplied from the power source.

The power converters 41 and 42 are controlled by a switching controller (not illustrated). Specifically, the switching controller switches the switching elements included in the power converters 41 and 42 between on and off. The power converter 41 set as the operation system converts direct-current power supplied through the primary terminals to three-phase alternating-current power and supplies the three-phase alternating-current power to the electric motor 51 through the contactor MC12. When the power converter 42 is set as the operation system upon failure of the power converter 41, the power converter 42 converts direct-current power supplied through the primary terminals to three-phase alternating-current power and supplies the three-phase alternating-current power to the electric motor 51 through the contactor MC22.

The contactors MC12 and MC22 are controlled by the contactor controller, similarly to the contactors MC11 and MC21. When the contactor MC12 is closed, the primary terminals and the respective secondary terminals of the contactor MC12 are electrically connected to each other. When the contactor MC12 is opened, the primary terminals and the secondary terminals of the contactor MC12 are electrically disconnected. When the contactor MC22 is closed, the primary terminals and the respective secondary terminals of the contactor MC22 are electrically connected to each other. When the contactor MC22 is opened, the primary terminals and the secondary terminals of the contactor MC22 are electrically disconnected.

Electronic components included in the power converter 41 form the heating elements 31 in FIGS. 1 to 5. Electronic components included in the power converter 42 form the heating elements 32 in FIGS. 1 to 5. While the power converter 41 set as an operation system operates normally, the electronic components forming the heating elements 31 conduct electricity and generate heat, whereas the electronic components forming the heating elements 32 do not generate heat without electric conduction. Thus, the first main surface 11a of the heat-receiving block 11 has temperature variations.

A cooling operation of the cooling device 1 included in the power conversion device 30 in a standby redundancy system for cooling the heating elements 31 and 32 is described using the power converter 41 set as the operation system operating normally. When heat generated by the heating elements 31 is transferred to the refrigerant 16 through the heat-receiving block 11 and the second heat pipes 12, part of the refrigerant 16 evaporates and moves toward an area inside the second heat pipes 12 having a low temperature. While moving, the evaporated refrigerant 16 dissipates heat to the surrounding heat-receiving block 11 through the second heat pipes 12. Then, the refrigerant 16 that has dissipated heat liquefies. The liquefied refrigerant 16 is heated with heat transferred from the heating elements 31 and then evaporates again. This circulation of the refrigerant 16 repeating evaporation and liquefaction transfers heat transferred from the heating elements 31 in the Y-direction in which the second heat pipes 12 extend to the heat-receiving block 11 around the second heat pipes 12.

When the heat generated by the heating elements 31 is transferred to the refrigerant 16, part of the refrigerant 16 remaining without evaporating, in other words, the refrigerant 16 in a liquid state causes convection. The convection caused in the refrigerant 16 transfers heat transferred from the heating elements 31 in the Y-direction to the heat-receiving block 11 around the second heat pipes 12.

Circulation of the refrigerant 16 transfers heat transferred to the heat-receiving block 11 to the refrigerant 15 through the header pipes 13a forming the first heat pipes 13. Part of the refrigerant 15 that is enclosed in the header pipes 13a and receives heat from the heat-receiving block 11 and then evaporates, flows into the branch pipes 13b, and moves through the branch pipes 13b toward the upper ends in the vertical direction. While moving, the evaporated refrigerant 15 dissipates heat into the ambient air through the first heat pipes 13 and the fins 14.

As described above, the cooling device 1 according to Embodiment 1 includes the second heat pipes 12. Thus, heat generated by the heating elements 31 and 32 is transferred in the Y-direction, and the temperature difference on the heat-receiving block 11 in the Y-direction is reduced. Thus, the quantity of heat transferred to the multiple first heat pipes 13 arranged in the Y-direction has a small difference. Each of the multiple first heat pipes 13 arranged in the Y-direction dissipates heat. Thus, the cooling device 1 has higher cooling efficiency than a known cooling device not including the second heat pipes 12.

In the cooling device 1, the second heat pipes 12 are arranged adjacent to the first main surface 11a of the heat-receiving block 11 to which the heating elements 31 and 32 are fixed. The first heat pipes 13 for heat dissipation are arranged at positions farther from the first main surface 11a than the second heat pipes 12 are, in other words, arranged adjacent to the second main surface 11b opposite to the first main surface 11a. Thus, the heat generated by the heating elements 31 and 32 is diffused by the second heat pipes 12 in the Y-direction to equalize heat. The first heat pipes 13 are arranged closer to the second main surface 11b than the second heat pipes 12. Thus, the branch pipes 13b extending away from the second main surface 11b are not obstructed by the second heat pipes 12. The cooling device 1 enables arrangement of multiple heat-dissipating first heat pipes 13 without being restricted by the shape or quantity of the second heat pipes 12, and thus improves heat dissipation.

Embodiment 2

The first heat pipes 13 and the second heat pipes 12 may be fixed to the heat-receiving block 11 at any positions that allow heat transfer of the second heat pipes 12 to reduce the temperature difference of the heat-receiving block 11 in the direction in which the second heat pipes 12 extend, and that allow heat dissipation of each of the multiple first heat pipes 13 arranged in the direction in which the second heat pipes 12 extend. The first heat pipes 13 and the second heat pipes 12 may be fixed to the heat-receiving block 11 with any method.

Figure 7:
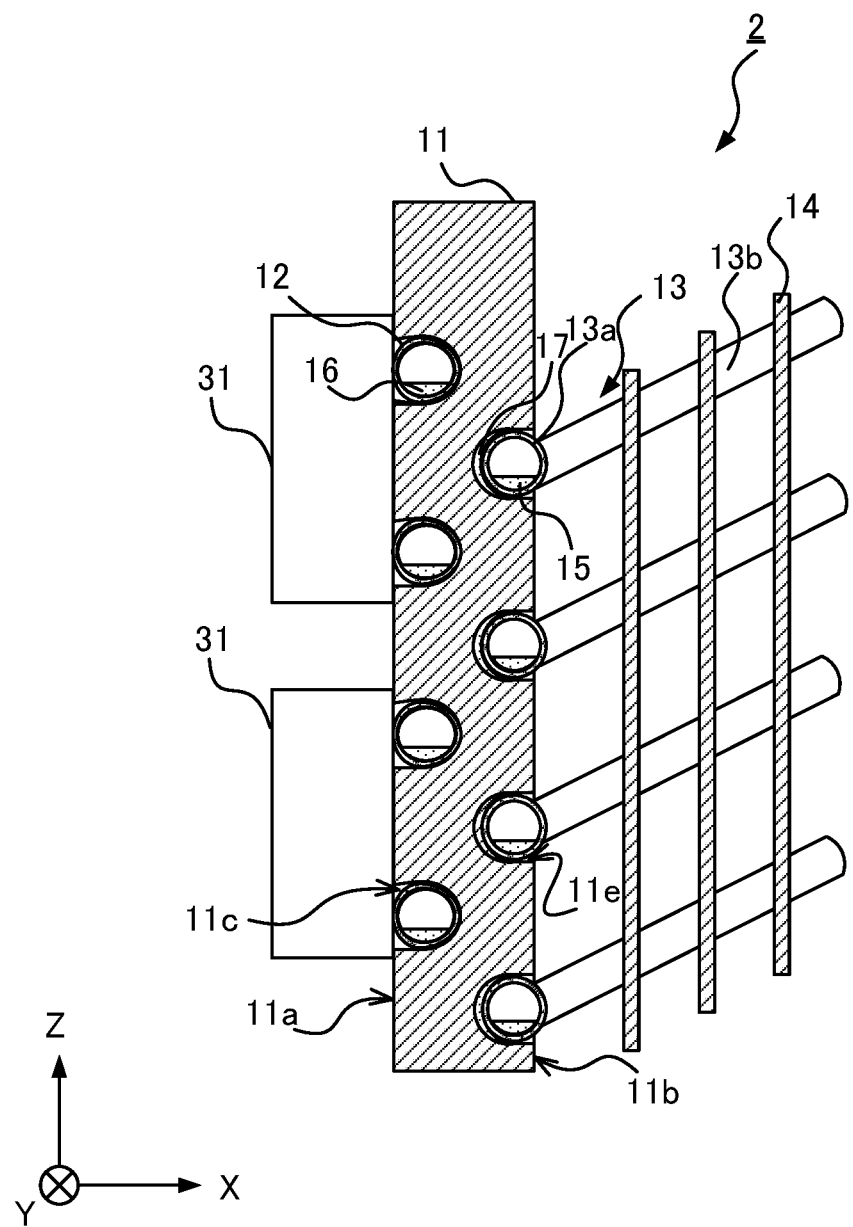
FIG. 7 is a cross-sectional view of a cooling device according to Embodiment 2 of the present disclosure.

A cooling device 2 according to Embodiment 2 illustrated in FIG. 7 differs from the cooling device 1 according to Embodiment 1 in the method for fixing the second heat pipes 12 to the heat-receiving block 11 and the positions at which the first heat pipes 13 are fixed. The cooling device 2 is mountable on the power conversion device 30, similarly to the cooling device 1.

The second main surface 11b of the heat-receiving block 11 included in the cooling device 2 has multiple grooves 11e instead of the multiple grooves 11d. Each groove 11e receives the corresponding first heat pipes 13. The grooves 11c and the grooves 11e are formed in the heat-receiving block 11 at different heights in the vertical direction. Thus, each of the second heat pipes 12 received in the grooves 11c and the corresponding header pipes 13a of the first heat pipes 13 received in the grooves 11e are located side by side in the plane orthogonal to the direction in which the second heat pipes 12 extend, or the XZ plane, in a direction crossing the first main surface 11a at an acute angle. In other words, the header pipes 13a of the first heat pipes 13 are arranged at positions different from the positions of the second heat pipes 12 in the Z-direction. In some embodiments, each of the second heat pipes 12 received in the grooves 11c and the corresponding header pipes 13a of the first heat pipes 13 received in the grooves 11e may be located side by side in the XZ plane in the direction crossing the first main surface 11a at 45 degrees. Arranging the first heat pipes 13 and the second heat pipes 12 in this manner enables arrangement of the first heat pipes 13 closer to the first main surface 11a than in the cooling device 1. Thus, heat generated by the heating elements 31 and 32 is efficiently transferred to the first heat pipes 13. In addition, the heat-receiving block 11 can reduce the thickness and thus reduces the size of the cooling device 2.

Figure 8:
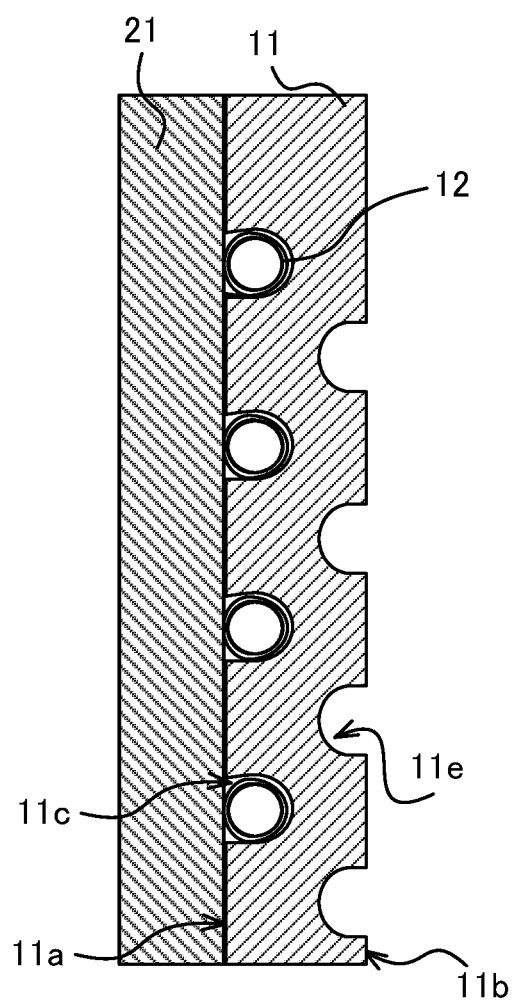
FIG. 8 is a diagram describing a method for fixing second heat pipes according to Embodiment 2.

The cooling device 2 has no second solder 18. Without being soldered, the second heat pipes 12 are placed into the grooves 11c and then pressed against the wall surfaces of the grooves 11c with the diameter increased, and thus are fixed to the heat-receiving block 11. Specifically, as illustrated in FIG. 8, the second heat pipes 12 are placed into the grooves 11c, and a jig 21 is fixed to the heat-receiving block 11 with a fastener (not illustrated). The first main surface 11a of the heat-receiving block 11 and the main surface of the jig 21 face each other. In a state in which the jig 21 is fixed to the heat-receiving block 11, the second heat pipes 12 are pressed from inside to increase the diameter of the second heat pipes 12. The outer peripheries of the second heat pipes 12 with the diameter increased come into contact with the grooves 11c. The second heat pipes 12 are thus fixed to the heat-receiving block 11. After the second heat pipes 12 are fixed to the heat-receiving block 11, the jig 21 is removed. The first heat pipes 13 are then fixed to the heat-receiving block 11 with the first solder 17, and the fins 14 are fixed to the branch pipes 13b forming the first heat pipes 13. This completes the cooling device 2.

As described above, the cooling device 2 according to Embodiment 2 includes the first heat pipes 13 and the second heat pipes 12. Each of the first heat pipes 13 and the corresponding second heat pipes 12 are located side by side in a direction crossing the first main surface 11a at an acute angle. Thus, the first heat pipes 13 can be arranged closer to the first main surface 11a to which the heating elements 31 and 32 are fixed than in the cooling device 1. Thus, heat generated by the heating elements 31 and 32 can be efficiently transferred to the first heat pipes 13. The cooling device 2 can thus have higher cooling efficiency than the cooling device 1.

In addition, the second heat pipes 12 with the diameter increased have the outer peripheries pressed against the grooves 11c. This structure eliminates the preparation of two types of solder with different melting points to fix the second heat pipes 12 to the heat-receiving block 11.

Embodiment 3

Figure 9:
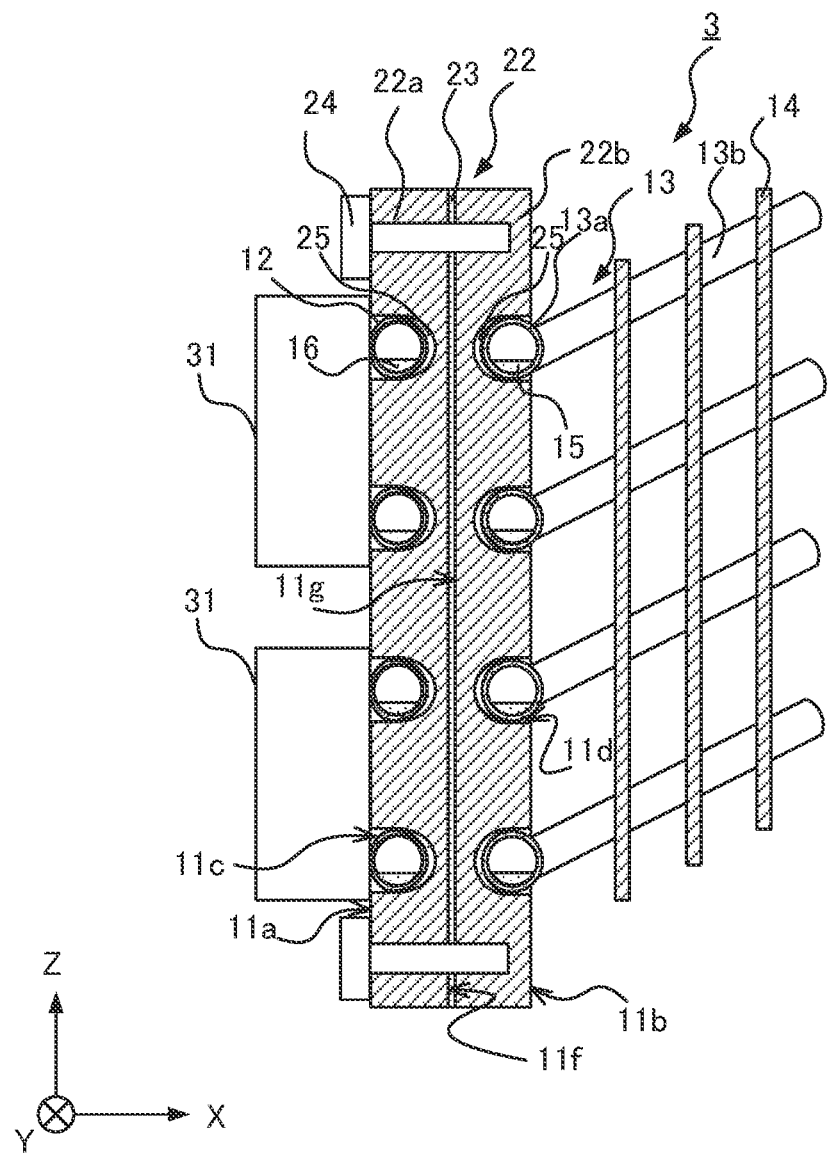
FIG. 9 is a cross-sectional view of a cooling device according to Embodiment 3 of the present disclosure.

The heat-receiving block 11 may have any structure that can transfer heat transferred from the heating elements 31 and 32, to the second heat pipes 12 and the first heat pipes 13. A cooling device 3 illustrated in FIG. 9 includes a heat-receiving block 22 including a first block 22a and a second block 22b, instead of the heat-receiving block 11. The cooling device 3 also includes a heat transfer member 23 applied to contact surfaces of the first block 22a and the second block 22b, and fasteners 24 that fix the first block 22a to the second block 22b. The cooling device 3 includes third solder 25 instead of the first solder 17 and the second solder 18. The cooling device 3 has the same structure as the cooling device 1 except for the structure of the heat-receiving block 22. The cooling device 3 is mountable on the power conversion device 30 similarly to the cooling devices 1 and 2.

The first block 22a and the second block 22b forming the heat-receiving block 22 are each formed of a highly thermally conductive material, for example, metal such as copper or aluminum.

As in Embodiment 1, the first main surface 11a of the first block 22a has multiple grooves 11c, and the grooves 11c receive the respective second heat pipes 12. A third main surface 11f of the first block 22a opposite to the first main surface 11a receives the heat transfer member 23, for example, a compound or grease with high thermal conductivity.

As in Embodiment 1, the second main surface 11b of the second block 22b has multiple grooves 11d, and the grooves 11d receive the respective first heat pipes 13. A fourth main surface 11g of the second block 22b opposite to the second main surface 11b also receives the heat transfer member 23. Applying the heat transfer member 23 to the contact surfaces of the first block 22a and the second block 22b reduces the likelihood that the thermal conductivity decreases at the contact surfaces of the first block 22a and the second block 22b.

The fasteners 24 fix the first block 22a to the second block 22b. Specifically, each fastener 24 passes through a through-hole in the first block 22a to be received in a threaded hole in the second block 22b to be fastened. Thus, the first block 22a is fixed to the second block 22b with the third main surface 1 if of the first block 22a in contact with the fourth main surface 11g of the second block 22b.

The third solder 25 applied to the grooves 11d melts when heated, and then is cooled to solidify. Thus, the third solder 25 fixes the first heat pipes 13 received in the grooves 11d to the heat-receiving block 22. The third solder 25 applied to the grooves 11c melts when heated, and then is cooled to solidify. Thus, the third solder 25 fixes the second heat pipes 12 received in the grooves 11c to the heat-receiving block 22. The third solder 25 is formed of a substance having a melting point sufficiently higher than the temperature that the heat-receiving block 22 can have when heated with heat transferred from the heating elements 31 and 32.

The first block 22a to which the second heat pipes 12 are fixed is fixed, with the fasteners 24, to the second block 22b to which the first heat pipes 13 are fixed, and the fins 14 are fixed to the branch pipes 13b forming the first heat pipes 13. This completes the cooling device 3.

As described above, the cooling device 3 according to Embodiment 3 is acquired by fixing the second heat pipes 12 to the first block 22a, fixing the first heat pipes 13 to the second block 22b, and then fixing the first block 22a to the second block 22b. Thus, the third solder 25 can be used for both fixing the second heat pipes 12 to the first block 22a and fixing the first heat pipes 13 to the second block 22b. This structure eliminates the preparation of multiple types of solder with different melting points.

The present disclosure is not limited to the above embodiments. For example, any two or more of the above embodiments may be combined as appropriate.

For example, the heat-receiving block 11 included in the cooling device 1 may have grooves 11c and grooves 11d at different positions in the vertical direction. Each of the first heat pipes 13 and the corresponding second heat pipes 12 are thus located side by side in a direction crossing the first main surface 11a at an acute angle.

For example, the heat-receiving block 11 included in the cooling device 2 may include multiple components similarly to the heat-receiving block 22.

Instead of a plate shape, the heat-receiving block 11 may have any shape to which the first heat pipes 13 and the second heat pipes 12 can be fixed and having the first main surface 11a to which the heating elements 31 and 32 can be fixed.

The first heat pipes 13 and the second heat pipes 12 may be fixed to the heat-receiving block 11 with any method. For example, the cooling devices 1 to 3 may include an adhesive to bond the first heat pipes 13 to the heat-receiving block 11. The cooling devices 1 to 3 may include an adhesive to bond the second heat pipes 12 to the heat-receiving block 11.

Instead of a circular shape, the second heat pipes 12, the header pipes 13a, and the branch pipes 13b may have a flat shape in a cross section orthogonal to the longitudinal directions. The flat shape is acquired by reducing the width of a circle in one direction from the original circle, and includes an oval, a streamline, and an ellipse. An ellipse refers to a shape with the outer edges of circles with the same diameter connected with straight lines. When the second heat pipes 12 each having a flat shape are fixed to the heat-receiving block 11 with the longitudinal direction of the flat shape being parallel to the Z-direction, heat is transferred from the heat-receiving block 11 to the second heat pipes 12 with higher efficiency. Similarly, when the header pipes 13a each having a flat shape are fixed to the heat-receiving block 11 with the longitudinal direction of the flat shape being parallel to the Z-direction, heat is transferred from the second heat pipes 12 to the header pipe 13a through the heat-receiving block 11 with higher efficiency. When the branch pipes 13b are fixed to the header pipes 13a to extend in the direction in which the cooling air flows, turbulence near the branch pipes 13b is reduced, and the cooling efficiency is improved.

The first heat pipes 13 and the second heat pipes 12 may be fixed to the heat-receiving block 11 at any positions that allow the second heat pipes 12 to reduce the temperature difference on the heat-receiving block 11 in the direction in which the second heat pipes 12 extend, and that allow heat dissipation of each of the multiple first heat pipes 13 arranged in the direction in which the second heat pipes 12 extend. For example, the second heat pipes 12 may be arranged inside the heat-receiving block 11. For example, the first heat pipes 13 may be in contact with the second heat pipes 12.

The first heat pipes 13 may have any structure that dissipates heat transferred from the heat-receiving block 11 into ambient air. For example, each first heat pipe 13 may include a header pipe 13a extending along the second heat pipes 12, and two branch pipes 13b extending from both ends of the header pipe 13a away from the second main surface 11b.

Any number of the first heat pipes 13 may be included.

The heat conductors 12 may have any structure that transfers heat transferred from the heating elements 31 and 32 inside the heat-receiving block 11. For example, each heat conductor 12 may be a member extending in the Y-direction and formed of a more highly thermally conductive substance than the heat-receiving block 11, for example, a graphene plate.

Any number of the heat conductors 12 may be included.

In Embodiment 2, the second heat pipes 12 are pressed from inside as an example method for increasing the diameter of the second heat pipes 12. The method is not limited to the above example. Any known method may be used to increase the diameter of the second heat pipes 12. For example, the diameter of the second heat pipes 12 may be increased by increasing the internal pressure by heating the second heat pipes 12 to a high temperature.

The heat transfer member 23 included in the cooling device 3 may be applied to the third main surface 11f of the first block 22a alone or the fourth main surface 11g of the second block 22b alone.

Each fastener 24 may pass through the through-hole in the second block 22b, and may be received in a threaded hole in the first block 22a to be fastened.

The power conversion device 30 is not limited to a power conversion device in a standby redundancy system. The power conversion device 30 may be used as any power conversion device including electronic components with different quantities of heat.

In the above example, multiple heating elements 31 and 32 are fixed to the first main surface 11a, but any number of the heating elements 31 and 32 may be fixed. For example, a single heating element having temperature variations in portions may be fixed to the first main surface 11a.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST 1, 2, 3 Cooling device
11, 22 Heat-receiving block
11a First main surface
11b Second main surface
11c, 11d, 11e Groove
11f Third main surface
11g Fourth main surface
12 Heat conductor (Second heat pipe)
13 First heat pipe
13a Header pipe
13b Branch pipe
14 Fin
15, 16 Refrigerant
17 First solder
18 Second solder
21 Jig
22a First block
22b Second block
23 Heat transfer member
24 Fastener
25 Third solder
30 Power conversion device
30a Positive electrode terminal
30b Negative electrode terminal
31, 32 Heating element
33 Housing
33a Enclosed space
33b Open space
34 Partition
34a Opening
35 Intake-exhaust port
41, 42 Power converter
51 Electric motor
FC1, FC2 Filter capacitor
FL1, FL2 Filter reactor
MC11, MC12, MC21, MC22 Contactor

The invention claimed is:

1. A cooling device comprising:
a heat-receiving block having a first main surface to which a heating element is fixed;
a heat conductor extending along the first main surface and fixed to the heat-receiving block with the heat conductor being partially exposed and in direct contact with the heating element; and
first heat pipes arranged in a direction in which the heat conductor extends and fixed to the heat-receiving block at positions farther from the first main surface than the heat conductor is, wherein each of the first heat pipes includes
a header pipe extending along the heat conductor, and
a branch pipe continuous with the header pipe and extending away from the heat-receiving block, and the heat conductor and the header pipes extend in a horizontal direction, are fixed to the heat-receiving block at different heights in a vertical direction, and are located side by side in a direction crossing the first main surface at an acute angle.

2. The cooling device according to claim 1, wherein the heat conductor includes a second heat pipe enclosing a refrigerant.

3. A cooling device comprising:
a heat-receiving block having a first main surface to which a heating element is fixed;
a heat conductor extending along the first main surface and fixed to the heat-receiving block with the heat conductor being partially exposed and in direct contact with the heating element; and
first heat pipes arranged in a direction in which the heat conductor extends and fixed to the heat-receiving block at positions farther from the first main surface than the heat conductor is, wherein each of the first heat pipes includes
a header pipe extending along the heat conductor, and
a branch pipe continuous with the header pipe and extending away from the heat-receiving block, and the heat conductor includes a second heat pipe enclosing a refrigerant.

4. The cooling device according to claim 3, wherein the heat conductor and the header pipes are located side by side in a direction orthogonal to the first main surface.

5. The cooling device according to claim 1, further comprising:
an adhesive bonding the first heat pipes to the heat-receiving block.

6. The cooling device according to claim 3, further comprising:
an adhesive bonding the first heat pipes to the heat-receiving block.

7. The cooling device according to claim 1, further comprising:
first solder fixing the first heat pipes to the heat-receiving block.

8. The cooling device according to claim 3, further comprising:
first solder fixing the first heat pipes to the heat-receiving block.

9. The cooling device according to claim 1, wherein
the heat-receiving block has a groove, and
the heat conductor is received in the groove and in direct contact with a wall surface of the groove.

10. The cooling device according to claim 3, wherein
the heat-receiving block has a groove, and
the heat conductor is received in the groove and in direct contact with a wall surface of the groove.

11. The cooling device according to claim 7 further comprising:
second solder bonding the heat conductor to the heat-receiving block.

12. The cooling device according to claim 6 further comprising:
second solder bonding the heat conductor to the heat-receiving block.

13. The cooling device according to claim 7, further comprising:
second solder bonding the heat conductor to the heat-receiving block,
wherein the second solder has a higher melting point than the first solder.

14. The cooling device according to claim 8, further comprising:
second solder bonding the heat conductor to the heat-receiving block,
wherein the second solder has a higher melting point than the first solder.

15. The cooling device according to claim 1, wherein the heat-receiving block includes
a first block to which the heat conductor is fixed and having the first main surface to which the heating element is fixed,
a second block to which the first heat pipes are fixed, and
a fastener fastening the first block and the second block to each other.

16. The cooling device according to claim 3, wherein the heat-receiving block includes
a first block to which the heat conductor is fixed and having the first main surface to which the heating element is fixed,
a second block to which the first heat pipes are fixed, and
a fastener fastening the first block and the second block to each other.

17. A power conversion device comprising:
a cooling device including:
a heat-receiving block having a first main surface to which a heating element is fixed;
a heat conductor extending along the first main surface and fixed to the heat-receiving block with the heat conductor being partially exposed and in direct contact with the heating element; and
first heat pipes arranged in a direction in which the heat conductor extends and fixed to the heat-receiving block at positions farther from the first main surface than the heat conductor is; and
power converters to convert power supplied from a power source to power to be supplied to a load and to supply the converted power to the load,
wherein
the power converters are commonly connected to the power source,
the power converters are commonly connected to the load,
one power converter of the power converters is set as an operation system, and the other at least one power converter of the power converters is set as a standby system, and
a switching element included in the power converter set as the operation system included in the heating element and a switching element included in the power converter set as the standby system are arranged in a direction in which the heat conductor extends, and are fixed to the first main surface of the heat-receiving block included in the cooling device.

18. The power conversion device to claim 17, wherein the heat conductor includes a second heat pipe enclosing a refrigerant.

19. The power conversion device according to claim 17, wherein
the heat-receiving block has a groove, and
the heat conductor is received in the groove and in direct contact with a wall surface of the groove.

20. The power conversion device according to claim 17, wherein the heat-receiving block includes
a first block to which the heat conductor is fixed and having the first main surface to which the heating element is fixed,
a second block to which the first heat pipes are fixed, and
a fastener fastening the first block and the second block to each other.

* * * * *